US012716942B2

(12) United States Patent
Gupta et al.

(10) Patent No.: US 12,716,942 B2
(45) Date of Patent: Aug. 25, 2026

(54) SYSTEM AND METHOD FOR CONTROLLING AT-SPEED TESTING OF INTEGRATED CIRCUITS

(71) Applicant: NXP B.V., Eindhoven (NL)

(72) Inventors: Chandan Gupta, Greater Noida (IN); Shikhar Makkar, Palwal (IN); Saumya Pandey, Raseda (IN)

(73) Assignee: NXP B.V., Eindhoven (NL)

( * ) Notice: Subject to any disclaimer, the term of this patent is extended or adjusted under 35 U.S.C. 154(b) by 587 days.

(21) Appl. No.: 18/305,464

(22) Filed: Apr. 24, 2023

(65) Prior Publication Data

US 2024/0295602 A1 Sep. 5, 2024

(30) Foreign Application Priority Data

Mar. 1, 2023 (IN) ............................ 202341013744

(51) Int. Cl.
*G01R 31/317* (2006.01)
*G06F 1/08* (2006.01)
*H03K 19/20* (2006.01)

(52) U.S. Cl.
CPC ......... *G01R 31/31727* (2013.01); *G06F 1/08* (2013.01); *H03K 19/20* (2013.01)

(58) Field of Classification Search
CPC ...... G01R 31/31727; G01R 31/318594; G01R 31/318552; G06F 1/08
See application file for complete search history.

(56) References Cited

U.S. PATENT DOCUMENTS

| | | | | |
|---|---|---|---|---|
| 7,710,801 | B2 * | 5/2010 | Li | G01R 31/318594 365/201 |
| 8,607,108 | B2 * | 12/2013 | Fernandes | G01R 31/318552 714/731 |
| 9,500,706 | B2 | 11/2016 | Sanghani et al. | |
| 2008/0005635 | A1 | 1/2008 | Kaibel et al. | |
| 2008/0010572 | A1 | 1/2008 | Sul | |
| 2008/0010573 | A1 | 1/2008 | Sul | |
| 2014/0164860 | A1 | 6/2014 | Kim | |

* cited by examiner

*Primary Examiner* — Lam S Nguyen

(57) ABSTRACT

An integrated circuit (IC), including a clocking system, a plurality of clock gate controllers, and a plurality of clock gates, is provided. During a capture phase of an at-speed testing of the IC, the clocking system generates an at-speed clock signal including launch and capture pulses that are extracted from a reference clock signal based on a capture phase frequency. The plurality of clock gate controllers generates a plurality of enable signals such that for the launch pulse, one enable signal is asserted, and for the capture pulse, the same or different enable signal is asserted. Each of the plurality of clock gates is activated based on an assertion of a corresponding enable signal. Further, during the capture phase, one or more activated clock gates enable the at-speed testing of the IC based on the at-speed clock signal.

19 Claims, 6 Drawing Sheets

SYSTEM AND METHOD FOR CONTROLLING AT-SPEED TESTING OF INTEGRATED CIRCUITS

CROSS-REFERENCE TO RELATED APPLICATIONS

This application claims the priority under 35 U.S.C. § 119 of India patent application No. 202341013744, filed on 1 Mar. 2023, the contents of which are incorporated by reference herein.

BACKGROUND

Field of the Disclosure

The present disclosure relates generally to electronic circuits, and, more particularly, to a system and a method for controlling at-speed testing of integrated circuits.

Description of the Related Art

Scan chains are widely used in integrated circuits (ICs) to facilitate structural testing (e.g., at-speed testing) of the ICs. The at-speed testing includes a shift phase and a capture phase. During the shift phase, a test pattern is shifted through a scan chain, and during the capture phase, a response of an IC to the shifted pattern is captured in the scan chain. The IC is tested for structural faults based on the captured response. To capture the response, two operations, namely, a data launch operation and a data capture operation, are executed. In the data launch operation, data bits of the test pattern are launched in functional components of the IC, and in the data capture operation, outputs of such functional components are stored in the scan chain. Time instances at which the data launch and data capture operations are executed are paramount for accurate testing of the IC, as any deviation leads to inaccurate test results, thereby compromising the safety of the IC.

BRIEF DESCRIPTION OF THE DRAWINGS

The following detailed description of the embodiments of the present disclosure will be better understood when read in conjunction with the appended drawings. The present disclosure is illustrated by way of example, and not limited by the accompanying figures, in which like references indicate similar elements.

DETAILED DESCRIPTION OF EMBODIMENTS

Overview

Figure 1:
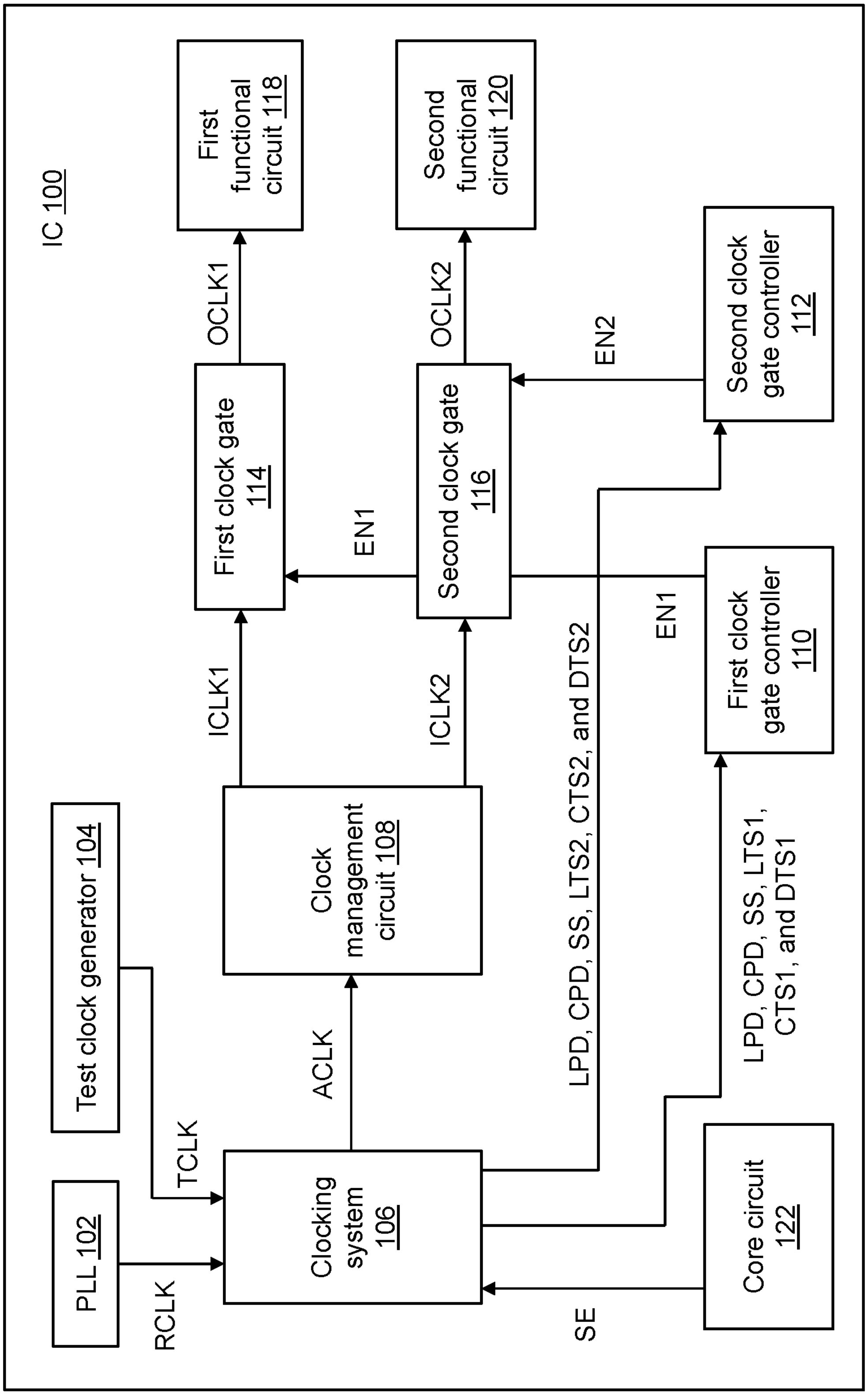
FIG. 1 illustrates a schematic block diagram of an integrated circuit (IC) in accordance with an embodiment of the present disclosure.

Conventionally, during a capture phase of an at-speed testing of an integrated circuit (IC), launch and capture pulses are generated to enable data launch and data capture operations, respectively. The launch and capture pulses have a frequency that is greater than a frequency of a test clock signal utilized during a shift phase of the at-speed testing, and are thus generated based on a functional clock signal (e.g., a phase-locked loop (PLL) clock signal). A clock management circuit with multiple dividers is included in the IC to generate multiple clock signals that are divided versions of the PLL clock signal. Further, chopping circuits (e.g., PLL-based scan units) are utilized to generate, based on the divided clock signals, control signals that enable extraction of the launch and capture pulses from the divided clock signals. The launch and capture pulses extracted from each divided clock signal are utilized to test functional circuits of a different clock domain of the IC. Typically, the dividers are deactivated during the shift phase and activated during the capture phase, and hence, require test control bits, and in turn, additional test registers in the IC, thereby resulting in increased size of the IC. Further, one chopping circuit is utilized for each clock domain which further increases the size of the IC. The chopping circuits are included in the functional clock path which imposes timing overhead. Additionally, the triggering of the chopping circuits, to align clock edges and extract the launch and capture pulses, is complex, especially for multi-domain at-speed testing, and leads to increased design and implementation complexity of the IC.

Various embodiments of the present disclosure disclose an IC that may include a clocking system, a plurality of clock gate controllers, a plurality of clock gates, and a plurality of functional circuits. The plurality of functional circuits may be associated with a plurality of clock domains of the IC. The clocking system may receive a reference clock signal (e.g., a PLL clock signal) and generate an at-speed clock signal. During a capture phase of an at-speed testing of the IC, the at-speed clock signal may include a launch pulse and a capture pulse extracted from the reference clock signal based on a frequency associated with the capture phase. The launch and capture pulses may be utilized to test the IC. The plurality of clock gate controllers may generate a plurality of enable signals such that for the launch pulse, one of the plurality of enable signals is asserted, and for the capture pulse, the same enable signal or a different enable signal is asserted.

The plurality of clock gates may receive the plurality of enable signals, with each clock gate being activated based on an assertion of a corresponding enable signal. During the capture phase, each of the plurality of clock gates may further receive the at-speed clock signal. In such a scenario, one or more activated clock gates, of the plurality of clock gates, may provide the launch and capture pulses of the at-speed clock signal to corresponding one or more functional circuits to enable the at-speed testing of the IC. When the same enable signal is asserted for the launch and capture pulses, data launch and data capture operations of the capture phase are executed in the same clock domain (e.g., a single clock gate is activated and enables testing of a corresponding functional circuit). Conversely, when different enable signals are asserted for the launch and capture pulses, the data launch and data capture operations are executed in two different clock domains (e.g., two different clock gates are activated and enable testing of two different functional circuits).

The clocking system and the plurality of clock gate controllers of the present disclosure thus enable the at-speed testing of the IC. The clocking system generates the at-speed clock signal having the launch and capture pulses of the desired frequency. As a result, a need to further divide the at-speed clock signal is eliminated. The dividers typically included in the clock management circuit may thus remain deactivated during the entire at-speed testing. As a result, the IC of the present disclosure is sans the test registers, and hence, has a lesser size than that of a conventional IC (e.g., an IC where the conventional technique of generating launch and capture pulses is implemented). In fact, the flip-flops of the dividers may be included in scan chains to further improve the structural testing of the IC of the present disclosure. Additionally, as the clocking system generates the at-speed clock signal having the launch and capture pulses of the desired frequency, a need to implement a chopping circuit to further extract any pulses from the at-speed clock signal is eliminated, thereby further decreasing the size of the IC of the present disclosure. Further, the absence of the chopping circuits in the functional clock path results in the timing overhead in the IC of the present disclosure being lesser than that of the conventional IC. Additionally, the clocking system includes simpler-to-design components such as shift registers and clock gates to generate the at-speed clock signal. Thus, the design and implementation complexity of the IC of the present disclosure is lesser than that of the conventional IC.

FIG. 1 illustrates a schematic block diagram of an integrated circuit (IC) 100 in accordance with an embodiment of the present disclosure. The IC 100 may include a phase-locked loop (PLL) 102, a test clock generator 104, a clocking system 106, and a clock management circuit 108. The IC 100 may further include a plurality of clock gate controllers, of which first and second clock gate controllers 110 and 112 are shown, and a plurality of clock gates, of which first and second clock gates 114 and 116 are shown. The plurality of clock gates may be coupled to the plurality of clock gate controllers such that the first and second clock gates 114 and 116 may be coupled to the first and second clock gate controllers 110 and 112, respectively. The IC 100 may further include a plurality of functional circuits, of which first and second functional circuits 118 and 120 are shown. The plurality of functional circuits may be coupled to the plurality of clock gates such that the first and second functional circuits 118 and 120 may be coupled to the first and second clock gates 114 and 116, respectively. Further, the plurality of functional circuits may be associated with a plurality of clock domains of the IC 100. In other words, each functional circuit may operate at a different clock frequency. Although not shown, each functional circuit may include one or more scan chains and other functional components of the IC 100. The IC 100 may be implemented in various automotive devices, network devices, mobile devices, or the like.

The IC 100 may typically operate in a functional mode (e.g., various functional operations may be performed in the IC 100). To ensure that the IC 100 is operating in a desired manner, the IC 100 may be structurally tested to detect faults in various functional components of the IC 100. At-speed testing is one type of structural testing that is implemented in the IC 100 to detect the faults therein. The at-speed testing includes a shift phase and a capture phase. During the shift phase, a test pattern (not shown) may be shifted through the IC 100 (e.g., the scan chains of the IC 100), and a response of the IC 100 to the test pattern may be captured during the capture phase. The IC 100 is tested for structural faults based on the captured response. The aforementioned components of the IC 100 facilitate the at-speed testing of the IC 100.

The PLL 102 and the test clock generator 104 may include suitable circuitry that may be configured to perform one or more operations. For example, the PLL 102 may be configured to generate a reference clock signal RCLK, whereas, the test clock generator 104 may be configured to generate a test clock signal TCLK. A frequency of the test clock signal TCLK is less than that of the reference clock signal RCLK. The reference clock signal RCLK may correspond to a free-running functional clock signal of the IC 100 and may be utilized during the functional mode and the capture phase of the at-testing of the IC 100. The test clock signal TCLK, on the other hand, may be utilized during the shift phase of the at-speed testing of the IC 100. The IC 100 may thus be synchronized based on the test clock signal TCLK and the reference clock signal RCLK during the shift and capture phases, respectively. In other words, the test pattern is shifted through the IC 100 in synchronization with the test clock signal TCLK, and the reference clock signal RCLK may be utilized to capture the response of the IC 100 to the test pattern.

The capture phase includes two operations, namely, a data launch operation and a data capture operation. During the data launch operation, data bits of the test pattern are launched in various functional components of the IC 100 and during the data capture operation, outputs (e.g., the response) from the functional components are stored in the IC 100 (e.g., the scan chains of the IC 100). To execute the data launch and data capture operations in an accurate manner, two clock pulses (e.g., a launch pulse and a capture pulse, respectively), separated by a predefined number of clock cycles, are required. The data launch and data capture operations may be executed at positive or negative edges of the launch and capture pulses, respectively. The predefined number of clock cycles may be determined based on a frequency associated with the capture phase (e.g., the frequency at which the IC 100 is to be tested). The frequency associated with the capture phase corresponds to the frequency of the launch and capture pulses (e.g., an inverse of a time duration between the positive or negative edges of the launch and capture pulses).

The frequency associated with the capture phase may be determined based on the clock domain that is to be tested. The at-speed testing may be of two types, namely, intra-domain testing and inter-domain testing. In the intra-domain testing, both the data launch and data capture operations are executed in the same clock domain (e.g., a first clock domain associated with the first functional circuit 118). In such a scenario, the frequency associated with the capture phase corresponds to the frequency of the first clock domain. On the other hand, in the inter-domain testing, the data launch and data capture operations are executed in two different clock domains (e.g., the first clock domain and a second clock domain, associated with the second functional circuit 120, having a frequency that is different from the frequency of the first clock domain). In such a scenario, the frequency associated with the capture phase corresponds to higher of the frequencies of the first and second clock domains. As the data launch and data capture operations are executed at the positive or negative edges, the frequency associated with the capture phase is required to be the higher of the two frequencies to ensure accurate inter-domain testing of the IC 100.

The clocking system 106 may be coupled to the PLL 102, the test clock generator 104, the clock management circuit 108, and the plurality of clock gate controllers (e.g., the first and second clock gate controllers 110 and 112). The clocking system 106 may be configured to receive the reference clock signal RCLK and the test clock signal TCLK from the PLL 102 and the test clock generator 104, respectively. Further, the clocking system 106 may be configured to receive a scan enable signal SE. The IC 100 may further include a core circuit 122 that may be configured to generate the scan enable signal SE. The scan enable signal SE is indicative of a current operational mode of the IC 100. For example, the scan enable signal SE is de-asserted during the capture phase and asserted during the shift phase. The clocking system 106 may be further configured to generate an at-speed clock signal ACLK based on the scan enable signal SE, the reference clock signal RCLK, and the test clock signal TCLK. During the shift phase, the at-speed clock signal ACLK is same as the test clock signal TCLK. Further, during the capture phase, the at-speed clock signal ACLK includes the launch and capture pulses that are extracted from the reference clock signal RCLK for the at-speed testing of the IC 100.

To facilitate the generation of the at-speed clock signal ACLK during the capture phase, the clocking system 106 may perform various operations. For example, the clocking system 106 may be further configured to store a plurality of launch configuration values (not shown) and a plurality of capture configuration values (not shown) in pairs such that each pair of launch and capture configuration values is for generating a clock signal of a predefined frequency. Further, the clocking system 106 may be configured to determine whether the at-speed testing (e.g., the data launch and data capture operations) is to be executed in a single clock domain or two different clock domains. In other words, the clocking system 106 may determine whether the at-speed testing corresponds to the intra-domain testing or the inter-domain testing. The clocking system 106 may be further configured to determine the frequency associated with the capture phase. For the intra-domain testing, the frequency associated with the capture phase corresponds to the frequency of the clock domain to be tested and for the inter-domain testing, the frequency associated with the capture phase corresponds to the higher of the frequencies of the two clock domains that are to be tested.

Based on the frequency associated with the capture phase, the clocking system 106 may be further configured to determine, from the plurality of launch configuration values and the plurality of capture configuration values, a launch configuration value (shown later in FIG. 2) and a capture configuration value (shown later in FIG. 2), respectively. The launch and capture configuration values include first and second pluralities of data bits, respectively. During the capture phase, one of the first plurality of data bits and one of the second plurality of data bits may be asserted and remaining data bits of the first and second pluralities of data bits may be de-asserted. A position of the asserted data bit in the launch configuration value and a position of the asserted data bit in the capture configuration value may be determined based on the frequency associated with the capture phase. In an exemplary scenario, each of the launch and capture configuration values has fifteen data bits. If the frequency associated with the capture phase is equal to the reference clock signal RCLK, consecutive data bits of the launch and capture configuration values (e.g., a third data bit of the launch configuration value and a fourth data bit of the capture configuration value) may be asserted. Similarly, if the frequency associated with the capture phase is equal to half of the reference clock signal RCLK, the asserted data bits of the launch and capture configuration values may be one data bit apart (e.g., the third data bit of the launch configuration value and a fifth data bit of the capture configuration value may be asserted).

For each cycle of the reference clock signal RCLK, the clocking system 106 may be further configured to output a data bit of the launch configuration value as a launch pulse data bit LPD and a data bit of the capture configuration value as a capture pulse data bit CPD. The launch and capture pulses are extracted from the reference clock signal RCLK based on the launch and capture pulse data bits LPD and CPD, respectively. For example, when the asserted data bit of the launch configuration value is outputted as the launch pulse data bit LPD, the launch pulse is extracted from the reference clock signal RCLK. Similarly, when the asserted data bit of the capture configuration value is outputted as the capture pulse data bit CPD, the capture pulse is extracted from the reference clock signal RCLK. Thus, during the capture phase of the at-speed testing of the IC 100, the at-speed clock signal ACLK includes the launch and capture pulses that are extracted from the reference clock signal RCLK based on the frequency associated with the capture phase.

The clocking system 106 may be further configured to provide the at-speed clock signal ACLK to the clock management circuit 108. The clock management circuit 108 may include suitable circuitry that may be configured to perform one or more operations. For example, the clock management circuit 108 may be configured to receive the at-speed clock signal ACLK from the clocking system 106 and generate first and second intermediate clock signals ICLK1 and ICLK2. During the shift and capture phases, each of the first and second intermediate clock signals ICLK1 and ICLK2 may be same as the at-speed clock signal ACLK. In other words, during the capture phase, each of the first and second intermediate clock signals ICLK1 and ICLK2 may include the launch and capture pulses of the frequency associated with the capture phase. The clock management circuit 108 may include a plurality of dividers (not shown) for dividing the received clock signal (e.g., the at-speed clock signal ACLK). However, the plurality of dividers is bypassed (e.g., is deactivated) during the at-speed testing of the IC 100. Thus, in an embodiment, during the at-speed testing, flip-flops (not shown) of the plurality of dividers may be included in the scan chains to further improve the at-speed testing of the IC 100.

The clocking system 106 may be further configured to generate a select signal SS. The select signal SS may indicate whether the at-speed testing corresponds to the intra-domain testing or the inter-domain testing. For example, the select signal SS may be de-asserted when the at-speed testing corresponds to the intra-domain testing. Conversely, the select signal SS may be asserted when the at-speed testing corresponds to the inter-domain testing.

The clocking system 106 may be further configured to generate different trigger signals for the intra-domain and inter-domain testing. For example, for the intra-domain testing, the clocking system 106 may be further configured to generate a plurality of domain trigger signals. The plurality of domain trigger signals may be generated for the plurality of clock gate controllers. The plurality of clock gate controllers may be further associated with the plurality of clock domains. Thus, the plurality of domain trigger signals may be generated for enabling the intra-domain testing of the plurality of clock domains. For example, the clocking system 106 may be further configured to generate first and second domain trigger signals DTS1 and DTS2 for the first and second clock gate controllers 110 and 112, respectively. A domain trigger signal is asserted for the entire capture phase when the data launch and data capture operations are to be executed in the same clock domain. For example, the first domain trigger signal DTS1 may be asserted when the data launch and data capture operations are to be executed in the first clock domain.

For the inter-domain testing, the clocking system 106 may be further configured to generate a plurality of launch trigger signals and a plurality of capture trigger signals. Each pair of launch and capture trigger signals may be generated for one clock gate controller. For example, the clocking system 106 may be configured to generate a first launch trigger signal LTS1 and a first capture trigger signal CTS1 for the first clock gate controller 110. The first launch trigger signal LTS1 and the first capture trigger signal CTS1 may be generated for enabling the data launch and data capture operations in the first clock domain, respectively. Similarly, the clocking system 106 may be configured to generate a second launch trigger signal LTS2 and a second capture trigger signal CTS2 for the second clock gate controller 112 and for enabling the data launch and data capture operations in the second clock domain, respectively.

During the capture phase, one of the plurality of launch trigger signals is asserted and remaining launch trigger signals of the plurality of launch trigger signals are de-asserted. Further, during the capture phase, one of the plurality of capture trigger signals is asserted and remaining capture trigger signals of the plurality of capture trigger signals are de-asserted. The asserted launch trigger signal is for the clock gate controller that is associated with the clock domain of the data launch operation. Similarly, the asserted capture trigger signal is for the clock gate controller that is associated with the clock domain of the data capture operation. For example, if the first and second clock domains (e.g., the first and second functional circuits 118 and 120) are to be tested with the data launch operation in the first clock domain and the data capture operation in the second clock domain, the first launch trigger signal LTS1 and the second capture trigger signal CTS2 may be asserted and the remaining launch and capture trigger signals may be de-asserted. Thus, the asserted launch trigger signal enables the data launch operation in the corresponding clock domain and the asserted capture trigger signal enables the data capture operation in the corresponding clock domain.

The first clock gate controller 110 may be coupled to the clocking system 106. The first clock gate controller 110 may be configured to receive the launch and capture pulse data bits LPD and CPD, the select signal SS, the first launch trigger signal LTS1, the first capture trigger signal CTS1, and the first domain trigger signal DTS1 from the clocking system 106. Based on the select signal SS, the launch and capture pulse data bits LPD and CPD, the first launch trigger signal LTS1, the first capture trigger signal CTS1, and the first domain trigger signal DTS1, the first clock gate controller 110 may be further configured to generate a first enable signal EN1. The first enable signal EN1 may be generated to control the first clock gate 114, and in turn, to facilitate the at-speed testing of the first functional circuit 118.

When the select signal SS is de-asserted, the first enable signal EN1 is same as the first domain trigger signal DTS1. In other words, the first enable signal EN1 is asserted during the capture phase of the intra-domain testing of the first functional circuit 118. When the select signal SS is asserted, the first enable signal EN1 is generated based on the launch and capture pulse data bits LPD and CPD, the first launch trigger signal LTS1, and the first capture trigger signal CTS1. In other words, the logic state of the first enable signal EN1 is controlled during the capture phase based on the launch and capture pulse data bits LPD and CPD, the first launch trigger signal LTS1, and the first capture trigger signal CTS1. For example, the first enable signal EN1 is asserted when the launch pulse data bit LPD and the first launch trigger signal LTS1 are asserted and/or when the capture pulse data bit CPD and the first capture trigger signal CTS1 are asserted.

The second clock gate controller 112 may be further configured to generate a second enable signal EN2 based on the select signal SS, the launch and capture pulse data bits LPD and CPD, the second launch trigger signal LTS2, the second capture trigger signal CTS2, and the second domain trigger signal DTS2 in a similar manner as described above. Thus, the plurality of clock gate controllers may be configured to generate a plurality of enable signals (e.g., the first and second enable signals EN1 and EN2) such that for the launch pulse, one of the plurality of enable signals is asserted, and for the capture pulse, the same enable signal or a different enable signal is asserted. For example, the assertion of the first enable signal EN1 for the launch and capture pulses is indicative of the data launch and data capture operations being executed in the same clock domain (e.g., the first clock domain). Conversely, the assertion of the first enable signal EN1 for the launch pulse and the assertion of the second enable signal EN2 for the capture pulse are indicative of the data launch operation being executed in one clock domain (e.g., the first clock domain) and the data capture operation being executed in another clock domain (e.g., the second clock domain).

The first clock gate 114 may be coupled to the first clock gate controller 110, the clock management circuit 108, and the first functional circuit 118. The first clock gate 114 may include suitable circuitry that may be configured to perform one or more operations. For example, the first clock gate 114 may be configured to receive the first intermediate clock signal ICLK1 and the first enable signal EN1 from the clock management circuit 108 and the first clock gate controller 110, respectively. During the capture phase, the first intermediate clock signal ICLK1 is same as the at-speed clock signal ACLK. Thus, the first clock gate 114 may receive the at-speed clock signal ACLK during the capture phase. Further, the first clock gate 114 may be configured to generate a first output clock signal OCLK1 based on the first intermediate clock signal ICLK1 and the first enable signal EN1, and provide the first output clock signal OCLK1 to the first functional circuit 118 to enable the at-speed testing of the first functional circuit 118. The first output clock signal OCLK1 may be de-asserted based on the de-assertion of the first enable signal EN1. Further, based on the assertion of the first enable signal EN1, the first output clock signal OCLK1 may be same as the first intermediate clock signal ICLK1. In other words, the first clock gate 114 is activated based on the assertion of the first enable signal EN1.

When the data launch operation is to be executed in the first clock domain, the first enable signal EN1 is asserted concurrently with the launch pulse being received by the first clock gate 114. Thus, the first clock gate 114 is activated and may provide the launch pulse (e.g., the first output clock signal OCLK1) to the first functional circuit 118 to enable the at-speed testing of the first functional circuit 118. Similarly, when the data capture operation is to be executed in the first clock domain, the first enable signal EN1 is asserted concurrently with the capture pulse being received by the first clock gate 114. Thus, the first clock gate 114 is activated and may provide the capture pulse (e.g., the first output clock signal OCLK1) to the first functional circuit 118 to enable the at-speed testing of the first functional circuit 118. When the data launch operation and/or the data capture operation are not to be executed in the first clock domain, the first enable signal EN1 remains de-asserted, and in turn, the first output clock signal OCLK1 remains de-asserted. Thus, during the capture phase, the first output clock signal OCLK1 may be de-asserted or may include the launch pulse and/or the capture pulse from the at-speed clock signal ACLK.

The second clock gate 116 may be further configured to generate a second output clock signal OCLK2 based on the second intermediate clock signal ICLK2 and the second enable signal EN2 and provide the second output clock signal OCLK2 to the second functional circuit 120 in a similar manner as described above. Thus, the plurality of clock gates may be configured to receive the plurality of enable signals from the plurality of clock gate controllers, with each clock gate being activated based on the assertion of a corresponding enable signal. During the capture phase, each of the plurality of clock gates may be further configured to receive the at-speed clock signal ACLK (e.g., the launch and capture pulses of the corresponding intermediate clock signals), and one or more activated clock gates, of the plurality of clock gates, may be configured to enable the at-speed testing of the IC 100 based on the at-speed clock signal ACLK. In other words, one clock gate, that is activated for the launch pulse, may be configured to provide the launch pulse to the corresponding functional circuit to enable the data launch operation therein. Further, the same or different clock gate, that is activated for the capture pulse, may be configured to provide the capture pulse to the corresponding functional circuit to enable the data capture operation therein.

The first functional circuit 118 may be coupled to the first clock gate 114. The first functional circuit 118 may be configured to receive the first output clock signal OCLK1 from the first clock gate 114. During the capture phase, if the first clock gate 114 is activated for the launch pulse, the first functional circuit 118 may be configured to receive the launch pulse from the first clock gate 114 and execute the data launch operation based on the launch pulse. Further, if the first clock gate 114 is activated for the capture pulse, the first functional circuit 118 may be configured to receive the capture pulse from the first clock gate 114 and execute the data capture operation based on the capture pulse. Thus, based on the launch pulse of the first output clock signal OCLK1, the data bits of the test pattern may be launched in the first functional circuit 118 (e.g., in various functional components of the first functional circuit 118). Further, based on the capture pulse of the first output clock signal OCLK1, the response of the first functional circuit 118 to the test pattern is captured in the first functional circuit 118 (e.g., in the scan chains of the first functional circuit 118). The first functional circuit 118 may be tested based on the captured response.

The second functional circuit 120 may be similarly coupled to the second clock gate 116, and configured to receive the second output clock signal OCLK2. During the capture phase, if the second clock gate 116 is activated for the launch pulse and/or the capture pulse, the second functional circuit 120 may be configured to receive the launch pulse and/or the capture pulse from the second clock gate 116 and execute the data launch operation and/or the data capture operation, respectively.

In operation, for the capture phase of the at-speed testing of the IC 100, the clocking system 106 may determine the clock domain in which the data launch operation is to be executed, the clock domain in which the data capture operation is to be executed, and whether the two clock domains are same or different. Accordingly, the clocking system 106 may generate the select signal SS, the plurality of launch trigger signals, the plurality of capture trigger signals, and the plurality of domain trigger signals.

Inter-Domain Testing

In one exemplary scenario, the data launch operation is to be executed in the first clock domain and the data capture operation is to be executed in the second clock domain. Thus, the select signal SS is asserted. Further, the first launch trigger signal LTS1 and the second capture trigger signal CTS2 are asserted, and the remaining launch and capture trigger signals are de-asserted. The clocking system 106 may then determine the frequency associated with the capture phase. The frequency associated with the capture phase may be the higher of the frequencies of the first and second clock domains. For the sake of ongoing discussion, it is assumed that the frequency of the first clock domain is higher than that of the second clock domain. Thus, the clocking system 106 may determine the launch configuration value and the capture configuration value based on the frequency of the first clock domain.

As the data launch operation is to be executed in the first clock domain, the first launch trigger signal LTS1 is asserted. Further, for one cycle of the reference clock signal RCLK, the launch pulse data bit LPD may be asserted. In such an instance, the launch pulse may be extracted from the reference clock signal RCLK and is received by the first and second clock gates 114 and 116. At the same time, the first enable signal EN1 is asserted as the first launch trigger signal LTS1 is asserted, whereas, the second enable signal EN2 is de-asserted as the second launch trigger signal LTS2 and the capture pulse data bit CPD are de-asserted. As a result, the first clock gate 114 is activated, and the launch pulse is provided to the first functional circuit 118 to facilitate the execution of the data launch operation therein. Subsequently (e.g., for the next cycle of the reference clock signal RCLK or after one or more cycles of the reference clock signal RCLK), the capture pulse data bit CPD may be asserted. As a result, the capture pulse may be extracted from the reference clock signal RCLK and may be received by the first and second clock gates 114 and 116. Simultaneously, the second enable signal EN2 is asserted as the second capture trigger signal CTS2 is asserted, whereas, the first enable signal EN1 is de-asserted as the first capture trigger signal CTS1 and the launch pulse data bit LPD are de-asserted. As a result, the second clock gate 116 is activated, and the capture pulse is provided to the second functional circuit 120 to facilitate the execution of the data capture operation therein. Thus, the inter-domain testing is executed in the IC 100.

Intra-Domain Testing

In another exemplary scenario, the data launch and data capture operations are to be executed in the first clock domain. Thus, the select signal SS is de-asserted. Further, the first domain trigger signal DTS1 is asserted and the remaining domain trigger signals are de-asserted. The frequency associated with the capture phase may be equal to the frequency of the first clock domain, and the launch configuration value and the capture configuration value may be determined based on the frequency of the first clock domain. Further, the first enable signal EN1 is asserted and the second enable signal EN2 is de-asserted. Thus, the first clock gate 114 is activated and the second clock gate 116 is deactivated during the capture phase.

When the launch pulse data bit LPD is asserted, the launch pulse is extracted from the reference clock signal RCLK and is received by the first and second clock gates 114 and 116. As exclusively the first clock gate 114 is activated, the first clock gate 114 provides the launch pulse to the first functional circuit 118 to facilitate the execution of the data launch operation therein. Subsequently (e.g., for the next cycle of the reference clock signal RCLK or after one or more cycles of the reference clock signal RCLK), the capture pulse data bit CPD may be asserted. As a result, the capture pulse may be extracted from the reference clock signal RCLK and may be received by the first and second clock gates 114 and 116. The activated first clock gate 114 provides the capture pulse to the first functional circuit 118 to facilitate the execution of the data capture operation therein. Thus, the intra-domain testing is executed in the IC 100.

During the shift phase, the first and second enable signals EN1 and EN2 may remain asserted, and the test clock signal TCLK may be provided to the first and second functional circuits 118 and 120, respectively. The IC 100 may include various shift phase control circuits (not shown) that facilitate the operation during the shift phase. Further, during the functional mode, the clocking system 106 may pass the reference clock signal RCLK without modification and the plurality of dividers may be activated to generate multiple clock signals of different frequencies. Further, similar to the shift phase, the first and second enable signals EN1 and EN2 may remain asserted during the functional mode to facilitate the provision of the clock signals to the corresponding functional circuits.

A single functional circuit is illustrated for one clock domain to keep the description concise and clear, and should not be considered a limitation of the present disclosure. In other embodiments, one clock domain may encompass multiple functional circuits, without deviating from the scope of the present disclosure.

Although FIG. 1 illustrates two clock gates, two clock gate controllers, and two functional circuits, the scope of the present disclosure is not limited to it. In various other embodiments, the IC 100 may include more than two clock gates, more than two clock gate controllers, and more than two functional circuits, without deviating from the scope of the present disclosure.

The scope of the present disclosure is not limited to the PLL 102 being utilized to generate the reference clock signal RCLK. In various other embodiments, the IC 100 may include any other clock generator that generates a free-running clock signal, without deviating from the scope of the present disclosure.

Figure 2:
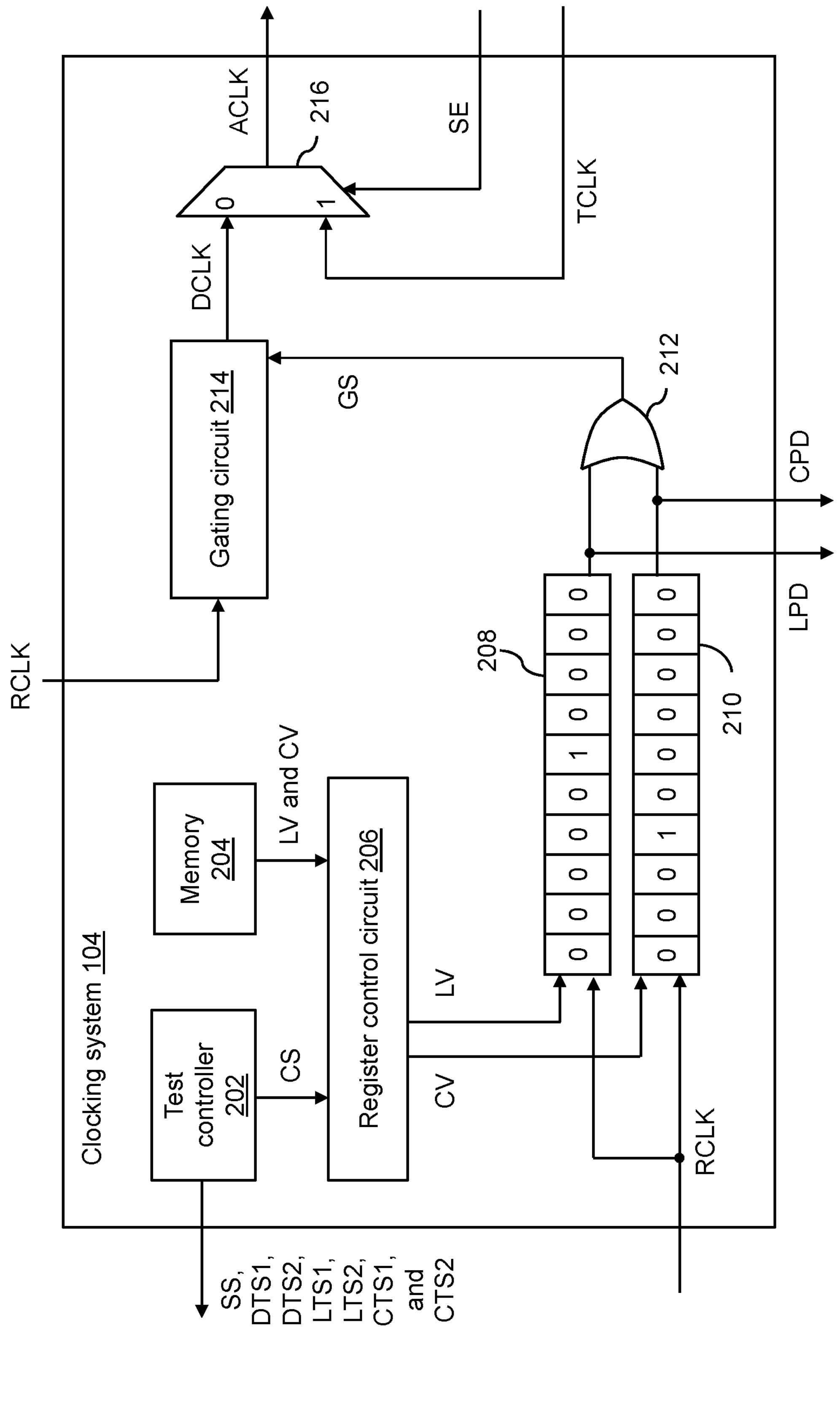
FIG. 2 illustrates a schematic block diagram of a clocking system of the IC of FIG. 1 in accordance with an embodiment of the present disclosure.

FIG. 2 illustrates a schematic block diagram of the clocking system 106 in accordance with an embodiment of the present disclosure. The clocking system 106 may include a test controller 202, a memory 204, a register control circuit 206, a launch shift register 208, a capture shift register 210, a first logic gate 212, a gating circuit 214, and a first multiplexer 216.

The test controller 202 may be coupled to the register control circuit 206 and the first and second clock gate controllers 110 and 112. The test controller 202 may include suitable circuitry that may be configured to perform one or more operations. For example, the test controller 202 may be configured to determine, for the capture phase of the at-speed testing, whether the data launch and data capture operations are to be executed in the same clock domain or two different clock domains. In other words, the test controller 202 may determine whether the at-speed testing corresponds to the intra-domain testing or the inter-domain testing. The test controller 202 may be further configured to generate the select signal SS indicating whether the at-speed testing corresponds to the intra-domain testing or the inter-domain testing and provide the select signal SS to each clock gate controller of the plurality of clock gate controllers. Further, the test controller 202 may be configured to identify, from the plurality of clock gate controllers, a clock gate controller that is associated with the clock domain of the data launch operation and a clock gate controller that is associated with the clock domain of the data capture operation.

The test controller 202 may be further configured to generate, for the plurality of clock gate controllers for the inter-domain testing, the plurality of launch trigger signals and the plurality of capture trigger signals. During the capture phase, one of the plurality of launch trigger signals (e.g., the launch trigger signal associated with the clock domain of the data launch operation) is asserted and the remaining launch trigger signals of the plurality of launch trigger signals are de-asserted. Similarly, one of the plurality of capture trigger signals (e.g., the capture trigger signal associated with the clock domain of the data capture operation) is asserted and the remaining capture trigger signals of the plurality of capture trigger signals are de-asserted. Further, the test controller 202 may be configured to provide the plurality of launch trigger signals and the plurality of capture trigger signals to the plurality of clock gate controllers. For example, the test controller 202 may be configured to provide the first launch trigger signal LTS1 and the first capture trigger signal CTS1 to the first clock gate controller 110, and the second launch trigger signal LTS2 and the second capture trigger signal CTS2 to the second clock gate controller 112. Thus, the asserted launch trigger signal is provided to the clock gate controller that is associated with the clock domain of the data launch operation and the asserted capture trigger signal is provided to the clock gate controller that is associated with the clock domain of the data capture operation.

The test controller 202 may be further configured to generate the plurality of domain trigger signals for the intra-domain testing. During the capture phase, each domain trigger signal is asserted based on the data launch operation and the data capture operation of the capture phase being executed in the clock domain associated with the corresponding clock gate controller. Further, the test controller 202 may be configured to provide the plurality of domain trigger signals to the plurality of clock gate controllers. For example, the test controller 202 may be configured to provide the first and second domain trigger signals DTS1 and DTS2 to the first and second clock gate controllers 110 and 112, respectively.

The test controller 202 may be further configured to determine the frequency associated with the capture phase. Further, the test controller 202 may be configured to generate a control signal CS that is indicative of the determined frequency and provide the control signal CS to the register control circuit 206. The control signal CS may enable the register control circuit 206 to determine the launch configuration value and the capture configuration value. The launch configuration value and the capture configuration value are hereinafter referred to and designated as the "launch configuration value LV" and the "capture configuration value CV", respectively.

The memory 204 may include suitable circuitry that may be configured to perform one or more operations. For example, the memory 204 may be configured to store a mapping between a plurality of frequency values, the plurality of launch configuration values, and the plurality of capture configuration values. Examples of the memory 204 may include a random-access memory (RAM), a read-only memory (ROM), sequential elements (e.g., flip-flops), or the like.

The register control circuit 206 may be coupled to the test controller 202, the memory 204, the launch shift register 208, and the capture shift register 210. The register control circuit 206 may include suitable circuitry that may be configured to perform one or more operations. For example, the register control circuit 206 may be configured to receive the control signal CS from the test controller 202. Based on the control signal CS (e.g., the frequency associated with the capture phase), the register control circuit 206 may be configured to determine the launch and capture configuration values LV and CV from the memory 204. In other words, the register control circuit 206 may be further configured to compare the frequency associated with the capture phase with the plurality of frequency values stored in the memory 204 and identify a frequency value of the plurality of frequency values that matches the frequency associated with the capture phase. The launch configuration value LV and the capture configuration value CV may be determined from the plurality of launch configuration values and the plurality of capture configuration values, respectively, based on being mapped to the identified frequency value. The register control circuit 206 may be further configured to load the launch configuration value LV in the launch shift register 208 and the capture configuration value CV in the capture shift register 210.

Each of the launch and capture shift registers 208 and 210 may be coupled to the PLL 102, and configured to receive the reference clock signal RCLK from the PLL 102. Further, the launch and capture configuration values LV and CV may be loaded in the launch and capture shift registers 208 and 210, respectively. The launch configuration value LV may include the first plurality of data bits and the capture configuration value CV may include the second plurality of data bits. The launch and capture shift registers 208 and 210 are synchronous with the reference clock signal RCLK such that for each cycle of the reference clock signal RCLK, a bit-shift operation is executed. The bit-shift operation may correspond to a right-shift operation or a left-shift operation. For the sake of brevity, the launch and capture shift registers 208 and 210 are shown to execute the right-shift operation in FIG. 2.

The first and second pluralities of data bits may be shifted in the launch and capture shift registers 208 and 210, respectively, based on the reference clock signal RCLK such that for each cycle of the reference clock signal RCLK, the launch and capture shift registers 208 and 210 may be further configured to output one data bit each of the launch and capture configuration values LV and CV as the launch and capture pulse data bits LPD and CPD, respectively. The launch and capture pulse data bits LPD and CPD may enable the extraction of the launch and capture pulses from the reference clock signal RCLK, respectively. During the capture phase, the launch pulse data bit LPD may be asserted for a first cycle of the reference clock signal RCLK and the capture pulse data bit CPD may be asserted for a second cycle of the reference clock signal RCLK that is different from the first cycle. A count of cycles between the first cycle and the second cycle may be determined based on the frequency associated with the capture phase.

The first logic gate 212 may be coupled to the launch and capture shift registers 208 and 210. The first logic gate 212 may be configured to receive the launch and capture pulse data bits LPD and CPD that are shifted out of the launch and capture shift registers 208 and 210, respectively, for each cycle of the reference clock signal RCLK. Based on the launch and capture pulse data bits LPD and CPD, the first logic gate 212 may be further configured to generate a gating signal GS. In an embodiment, the first logic gate 212 is an OR gate. Thus, the gating signal GS may be asserted based on the assertion of at least one of the launch and capture pulse data bits LPD and CPD. Conversely, the gating signal GS may be de-asserted based on the de-assertion of both the launch and capture pulse data bits LPD and CPD.

The gating circuit 214 may be coupled to the first logic gate 212 and the PLL 102. The gating circuit 214 may include suitable circuitry that may be configured to perform one or more operations. For example, the gating circuit 214 may be configured to receive the gating signal GS and the reference clock signal RCLK from the first logic gate 212 and the PLL 102, respectively. The gating circuit 214 may be further configured to generate a divided clock signal DCLK based on the gating signal GS and the reference clock signal RCLK. The divided clock signal DCLK may be de-asserted based on the de-assertion of the gating signal GS. Conversely, based on the assertion of the gating signal GS, the divided clock signal DCLK may be same as the reference clock signal RCLK. Thus, during the capture phase, the divided clock signal DCLK may include the launch and capture pulses that correspond to the first and second cycles of the reference clock signal RCLK, respectively.

The first multiplexer 216 may be coupled to the gating circuit 214, the test clock generator 104, and the core circuit 122. The first multiplexer 216 may be configured to receive the divided clock signal DCLK and the test clock signal TCLK from the gating circuit 214 and test clock generator 104, respectively. Further, the first multiplexer 216 may be configured to receive the scan enable signal SE from the core circuit 122. The first multiplexer 216 may be further configured to generate the at-speed clock signal ACLK based on the divided clock signal DCLK, the test clock signal TCLK, and the scan enable signal SE. Based on the assertion of the scan enable signal SE, the at-speed clock signal ACLK is same as the test clock signal TCLK. In other words, the at-speed clock signal ACLK is same as the test clock signal TCLK during the shift phase. Further, based on the de-assertion of the scan enable signal SE, the at-speed clock signal ACLK is same as the divided clock signal DCLK. In other words, the at-speed clock signal ACLK is same as the divided clock signal DCLK during the capture phase.

Figure 3:
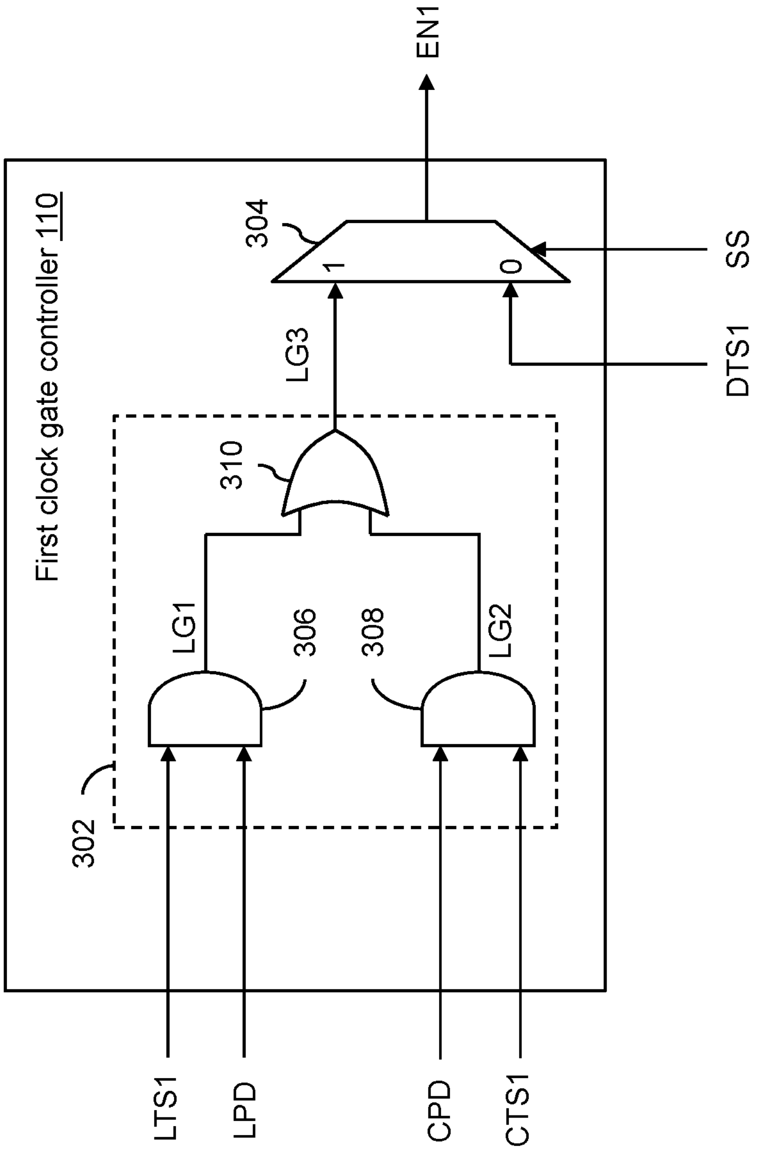
FIG. 3 illustrates a schematic circuit diagram of a first clock gate controller of the IC of FIG. 1 in accordance with an embodiment of the present disclosure.

FIG. 3 illustrates a schematic circuit diagram of the first clock gate controller 110 in accordance with an embodiment of the present disclosure. The first clock gate controller 110 may include a logic circuit 302 and a second multiplexer 304. Further, the logic circuit 302 may include a second logic gate 306, a third logic gate 308, and a fourth logic gate 310.

The second logic gate 306 may be coupled to the clocking system 106 (e.g., the test controller 202 and the launch shift register 208). The second logic gate 306 may be configured to receive the first launch trigger signal LTS1 and the launch pulse data bit LPD from the test controller 202 and the launch shift register 208, respectively. Based on the first launch trigger signal LTS1 and the launch pulse data bit LPD, the second logic gate 306 may be further configured to generate a first logic signal LG1. In an embodiment, the second logic gate 306 is an AND gate. Thus, the first logic signal LG1 may be asserted based on the assertion of both the first launch trigger signal LTS1 and the launch pulse data bit LPD. Conversely, the first logic signal LG1 may be de-asserted based on the de-assertion of at least one of the first launch trigger signal LTS1 and the launch pulse data bit LPD.

The third logic gate 308 may be coupled to the clocking system 106 (e.g., the test controller 202 and the capture shift register 210). The third logic gate 308 may be configured to receive the first capture trigger signal CTS1 and the capture pulse data bit CPD from the test controller 202 and the capture shift register 210, respectively. Based on the first capture trigger signal CTS1 and the capture pulse data bit CPD, the third logic gate 308 may be further configured to generate a second logic signal LG2. In an embodiment, the third logic gate 308 is an AND gate. Thus, the second logic signal LG2 may be asserted based on the assertion of both the first capture trigger signal CTS1 and the capture pulse data bit CPD. Conversely, the second logic signal LG2 may be de-asserted based on the de-assertion of at least one of the first capture trigger signal CTS1 and the capture pulse data bit CPD.

The fourth logic gate 310 may be coupled to the second and third logic gates 306 and 308. The fourth logic gate 310 may be configured to receive the first and second logic signals LG1 and LG2 from the second and third logic gates 306 and 308, respectively. Based on the first and second logic signals LG1 and LG2, the fourth logic gate 310 may be further configured to generate a third logic signal LG3. In an embodiment, the fourth logic gate 310 is an OR gate. Thus, the third logic signal LG3 may be de-asserted based on the de-assertion of both the first and second logic signals LG1 and LG2. Conversely, the third logic signal LG3 may be asserted based on the assertion of at least one of the first and second logic signals LG1 and LG2.

Thus, the logic circuit 302 may be coupled to the clocking system 106 (e.g., the test controller 202, the launch shift register 208, and the capture shift register 210). The logic circuit 302 may be configured to receive the first launch trigger signal LTS1 and the first capture trigger signal CTS1 from the test controller 202, the launch pulse data bit LPD from the launch shift register 208, and the capture pulse data bit CPD from the capture shift register 210. Further, based on the first launch trigger signal LTS1, the first capture trigger signal CTS1, the launch pulse data bit LPD, and the capture pulse data bit CPD, the logic circuit 302 may be configured to generate the third logic signal LG3. The third logic signal LG3 is thus asserted based on the assertion of both the launch pulse data bit LPD and the first launch trigger signal LTS1 and/or the assertion of both of the capture pulse data bit CPD and the first capture trigger signal CTS1. Conversely, the third logic signal LG3 may be de-asserted based on the de-assertion of at least one of the launch pulse data bit LPD and the first launch trigger signal LTS1 and the de-assertion of at least one of the capture pulse data bit CPD and the first capture trigger signal CTS1.

The second multiplexer 304 may be coupled to the clocking system 106 (e.g., the test controller 202) and the logic circuit 302 (e.g., the fourth logic gate 310). The second multiplexer 304 may be configured to receive the third logic signal LG3 and the first domain trigger signal DTS1 from the fourth logic gate 310 and the test controller 202, respectively. Further, the second multiplexer 304 may be configured to receive the select signal SS from the test controller 202. The second multiplexer 304 may be configured to generate the first enable signal EN1 based on the select signal SS, the third logic signal LG3, and the first domain trigger signal DTS1. Based on the assertion of the select signal SS, the first enable signal EN1 is same as the third logic signal LG3. Conversely, based on the de-assertion of the select signal SS, the first enable signal EN1 is same as the first domain trigger signal DTS1. Thus, for the intra-domain testing, the first enable signal EN1 is same as the first domain trigger signal DTS1. For example, the first enable signal EN1 is asserted for the entire capture phase if the data launch and data capture operations are to be executed in the first clock domain. Further, for the inter-domain testing, the first enable signal EN1 is same as the third logic signal LG3. Thus, during the capture phase, the first enable signal EN1 is asserted for the launch pulse if the data launch operation is to be executed in the first clock domain. Similarly, the first enable signal EN1 is asserted for the capture pulse if the data capture operation is to be executed in the first clock domain.

The second clock gate controller 112 may be structurally similar to the first clock gate controller 110.

The scope of the present disclosure is not limited to the implementation of the first clock gate controller 110 as described above. In other embodiments, even for intra-domain testing, the plurality of launch trigger signals and the plurality of capture trigger signals may be utilized instead of the plurality of domain trigger signals. In such a scenario, the launch and capture trigger signals associated with the same clock domain may be asserted. Further, the first clock gate controller 110 may be sans the second multiplexer 304 and the first enable signal EN1 may be same as the third logic signal LG3.

Figure 4:
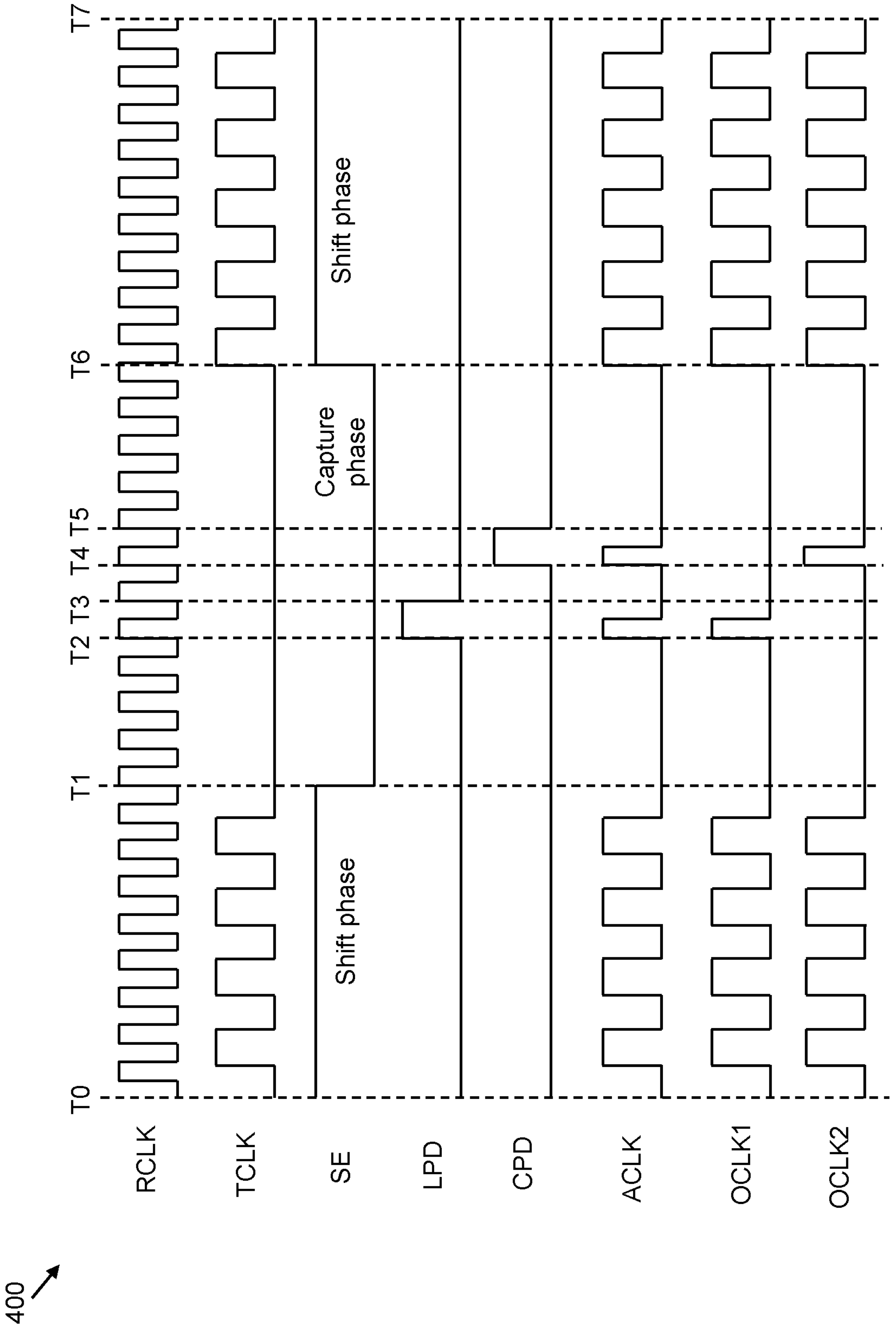
FIG. 4 represents a timing diagram that illustrates an operation of the IC of FIG. 1 in accordance with an embodiment of the present disclosure.

FIG. 4 represents a timing diagram 400 that illustrates an operation of the IC 100 in accordance with an embodiment of the present disclosure. The clocking system 106 may receive the reference clock signal RCLK, the test clock signal TCLK, and the scan enable signal SE, and generate the at-speed clock signal ACLK. The reference clock signal RCLK is a free-running clock signal, whereas, the test clock signal TCLK may be controlled based on the test requirement of the IC 100. Further, the scan enable signal SE is indicative of the current operational mode of the IC 100. Thus, during the shift phase, the scan enable signal SE is asserted and the at-speed clock signal ACLK is same as the test clock signal TCLK. Further, during the capture phase, the scan enable signal SE is de-asserted and the launch and capture pulses for the at-speed clock signal ACLK are extracted from the reference clock signal RCLK based on the launch pulse data bit LPD and the capture pulse data bit CPD, respectively. Further, based on the first and second enable signals EN1 and EN2 and the at-speed clock signal ACLK, the first and second output clock signals OCLK1 and OCLK2 may be generated.

During a time period T0-T1, the scan enable signal SE is asserted. In other words, the time period T0-T1 corresponds to the shift phase. Thus, the at-speed clock signal ACLK is same as the test clock signal TCLK. In such a scenario, the launch and capture pulse data bits LPD and CPD do not control the generation of the at-speed clock signal ACLK. Further, during the shift phase, the first and second output clock signals OCLK1 and OCLK2 are same as the at-speed clock signal ACLK (e.g., the test clock signal TCLK). Thus, the test pattern may be shifted in the scan chains of the first and second functional circuits 118 and 120 in synchronization with the test clock signal TCLK.

At time instance T1, the scan enable signal SE transitions from the asserted state to the de-asserted state, thereby activating the capture phase. In the capture phase, the at-speed clock signal ACLK may be generated based on the reference clock signal RCLK, the launch pulse data bit LPD, and the capture pulse data bit CPD. The test clock signal TCLK may be de-asserted during the capture phase.

During a time period T1-T2, the launch and capture pulse data bits LPD and CPD are de-asserted. Therefore, the at-speed clock signal ACLK and the first and second output clock signals OCLK1 and OCLK2 are de-asserted.

At time instance T2, the launch pulse data bit LPD transitions from the de-asserted state to the asserted state, and remains asserted during a time period T2-T3. Thus, during the time period T2-T3, the at-speed clock signal ACLK is same as the reference clock signal RCLK. In other words, the launch pulse is extracted from the reference clock signal RCLK. Further, for the sake of ongoing discussion, it is assumed that the data launch operation is to be executed in the first clock domain and the data capture operation is to be executed in the second clock domain. Thus, during the time period T2-T3, the first and second enable signals EN1 and EN2 are asserted and de-asserted, respectively. As a result, the first output clock signal OCLK1 is same as the at-speed clock signal ACLK, whereas, the second output clock signal OCLK2 is de-asserted. In other words, the first output clock signal OCLK1 may include the launch pulse to be utilized by the first functional circuit 118 to execute the data launch operation.

At time instance T3, the launch pulse data bit LPD transitions from the asserted state to the de-asserted state, and both the launch and capture pulse data bits LPD and CPD remain de-asserted during a time period T3-T4. As a result, the at-speed clock signal ACLK and the first and second output clock signals OCLK1 and OCLK2 remain de-asserted during a time period T3-T4. The time period T3-T4 may be determined based on the frequency associated with the capture phase. As illustrated in FIG. 4, the time period T3-T4 includes one cycle of the reference clock signal RCLK, which indicates that the frequency associated with the capture phase is equal to half of the frequency of the reference clock signal RCLK.

At time instance T4, the capture pulse data bit CPD transitions from the de-asserted state to the asserted state, and remains asserted during a time period T4-T5. Thus, during the time period T4-T5, the at-speed clock signal ACLK is same as the reference clock signal RCLK. In other words, the capture pulse is extracted from the reference clock signal RCLK. Further, as the data capture operation is to be executed in the second clock domain, during the time period T4-T5, the first and second enable signals EN1 and EN2 are de-asserted and asserted, respectively. Thus, the first output clock signal OCLK1 is de-asserted, whereas, the second output clock signal OCLK2 is same as the at-speed clock signal ACLK. In other words, the second output clock signal OCLK2 may include the capture pulse utilized by the second functional circuit 120 to execute the data capture operation.

At time instance T5, the capture pulse data bit CPD transitions from the asserted state to the de-asserted state, and both the launch and capture pulse data bits LPD and CPD remain de-asserted during a time period T5-T6. As a result, the at-speed clock signal ACLK and the first and second output clock signals OCLK1 and OCLK2 remain de-asserted. The time period T1-T6 may correspond to the capture phase of the at-speed testing.

At time instance T6, the scan enable signal SE transitions from the de-asserted state to the asserted state, thereby activating another shift phase. Thus, during a time period T6-T7, the scan enable signal SE is asserted and the at-speed clock signal ACLK is same as the test clock signal TCLK. Further, the first and second output clock signals OCLK1 and OCLK2 are same as the at-speed clock signal ACLK (e.g., the test clock signal TCLK). Thus, the response captured in the scan chains may be shifted out and a new test pattern may be shifted in the scan chains of the first and second functional circuits 118 and 120 in synchronization with the test clock signal TCLK during the time period T6-T7.

The timing diagram 400 illustrates the inter-domain testing of the IC 100. For the intra-domain testing, during the time period T4-T5, the capture pulse may be included in the first output clock signal OCLK1 instead of the second output clock signal OCLK2, or during the time period T2-T3, the launch pulse may be included in the second output clock signal OCLK2 instead of the first output clock signal OCLK1. Additionally, the time period T3-T4 may vary based on the frequency associated with the capture phase.

Figure 5A:
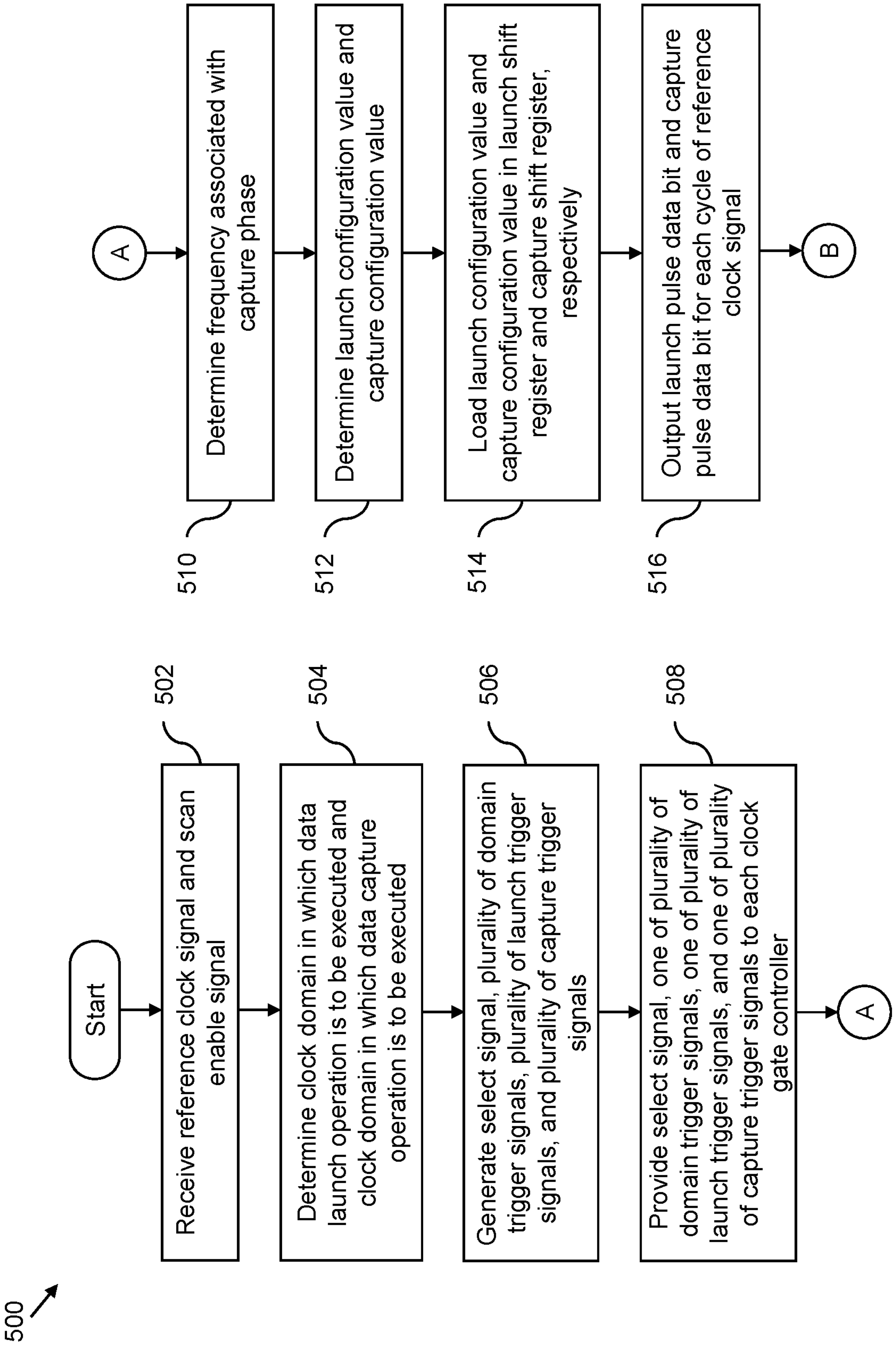
FIGS. 5A and 5B, collectively, represents a flowchart that illustrates a method for controlling an at-speed testing of the IC of FIG. 1 in accordance with an embodiment of the present disclosure.
Figure 5B:
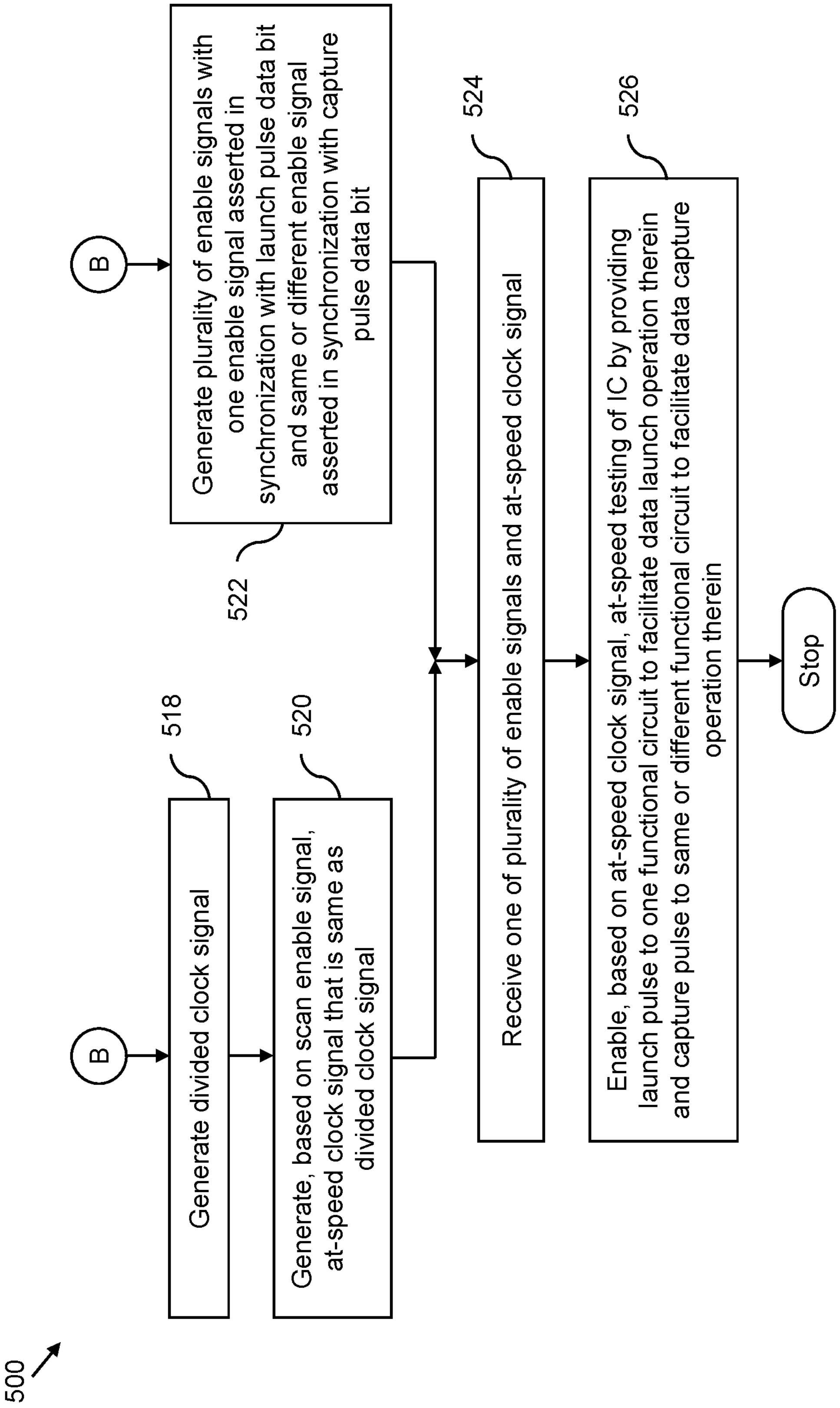

FIGS. 5A and 5B, collectively, represents a flowchart 500 that illustrates a method for controlling the at-speed testing of the IC 100 in accordance with an embodiment of the present disclosure.

Referring to FIG. 5A, at step 502, the clocking system 106 may receive the reference clock signal RCLK and the scan enable signal SE from the PLL 102 and the core circuit 122, respectively. At step 504, the clocking system 106 (e.g., the test controller 202) may determine the clock domain in which the data launch operation is to be executed and the clock domain in which the data capture operation is to be executed. The clocking system 106 may thus determine whether the at-speed testing corresponds to the intra-domain testing or the inter-domain testing. At step 506, the clocking system 106 (e.g., the test controller 202) may generate the select signal SS, the plurality of domain trigger signals, the plurality of launch trigger signals, and the plurality of capture trigger signals. At step 508, the clocking system 106 (e.g., the test controller 202) may provide the select signal SS, one of the plurality of domain trigger signals, one of the plurality of launch trigger signals, and one of the plurality of capture trigger signals to each clock gate controller of the plurality of clock gate controllers.

At step 510, the clocking system 106 (e.g., the test controller 202) may determine the frequency associated with the capture phase based on the clock domain of the data launch operation and the clock domain of the data capture operation. At step 512, the clocking system 106 (e.g., the register control circuit 206) may determine the launch configuration value LV and the capture configuration value CV based on the frequency associated with the capture phase. At step 514, the clocking system 106 (e.g., the register control circuit 206) may load the launch configuration value LV and the capture configuration value CV in the launch shift register 208 and the capture shift register 210, respectively. The launch and capture shift registers 208 and 210 may execute bit-shift operations in synchronization with the reference clock signal RCLK. At step 516, the clocking system 106 (e.g., the launch and capture shift registers 208 and 210) may output the launch pulse data bit LPD and the capture pulse data bit CPD for each cycle of the reference clock signal RCLK.

Referring to FIG. 5B, at step 518, the clocking system 106 (e.g., the gating circuit 214) may generate the divided clock signal DCLK based on the launch and capture pulse data bits LPD and CPD and the reference clock signal RCLK. When the launch pulse data bit LPD is asserted, the divided clock signal DCLK includes the launch pulse extracted from the reference clock signal RCLK. Similarly, when the capture pulse data bit CPD is asserted, the divided clock signal DCLK includes the capture pulse extracted from the reference clock signal RCLK. At step 520, the clocking system 106 (e.g., the first multiplexer 216) may generate, based on the scan enable signal SE, the at-speed clock signal ACLK that is same as the divided clock signal DCLK. Thus, during the capture phase, the at-speed clock signal ACLK includes the launch and capture pulses extracted from the reference clock signal RCLK. At step 522, the plurality of clock gate controllers may generate the plurality of enable signals with one enable signal asserted in synchronization with the launch pulse data bit LPD and the same or different enable signal asserted in synchronization with the capture pulse data bit CPD. For example, when the data launch operation is to be executed in the first clock domain, the first enable signal EN1 is asserted for the launch pulse. Similarly, when the data capture operation is to be executed in the second clock domain, the second enable signal EN2 is asserted for the capture pulse. Step 522 may be performed parallelly with steps 518 and 520.

At step 524, each clock gate of the plurality of clock gates may receive one of the plurality of enable signals and the at-speed clock signal ACLK. At step 526, the one or more activated clock gates may enable, based on the at-speed clock signal ACLK, the at-speed testing of the IC 100 by providing the launch pulse to one functional circuit to facilitate the data launch operation therein and the capture pulse to same or different functional circuit to facilitate the data capture operation therein.

Thus, in the present disclosure, the clocking system 106 and the plurality of clock gate controllers enable the at-speed testing of the IC 100. The clocking system 106 generates the at-speed clock signal ACLK having the launch and capture pulses of the desired frequency. Therefore, further division of the at-speed clock signal ACLK is eliminated. The plurality of dividers typically included in the clock management circuit 108 of the IC 100 may thus remain deactivated during the entire at-speed testing. As a result, the IC 100 is sans the test registers, and hence, has a lesser size than that of a conventional IC (e.g., an IC where the conventional technique of generating launch and capture pulses is implemented). In fact, the flip-flops of each divider may be included in scan chains to further improve the structural testing of the IC 100. As the clocking system 106 generates the at-speed clock signal ACLK having the launch and capture pulses of the desired frequency, a need to implement chopping circuits to further extract any pulses from the at-speed clock signal ACLK is eliminated, thereby further reducing the size of the IC 100. Further, the absence of the chopping circuits in the functional clock path results in the timing overhead in the IC 100 being lesser than that of the conventional IC. Additionally, the clocking system 106 includes simpler-to-design components such as shift registers and clock gates to generate the at-speed clock signal ACLK. Thus, the design and implementation complexity of the IC 100 is lesser than that of the conventional IC.

In the present disclosure, the term "assert" is used to mean placing a signal in an active state. For example, for an active-low signal, the signal is at a logic low state when asserted, and for an active-high signal, the signal is at a logic high state when asserted.

The detailed description of the appended drawings is intended as a description of the embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

In an embodiment of the present disclosure, the IC 100 is disclosed. The IC 100 may include the clocking system 106, the plurality of clock gate controllers (e.g., the first and second clock gate controllers 110 and 112), and the plurality of clock gates (e.g., the first and second clock gates 114 and 116). The clocking system 106 may be configured to receive the reference clock signal RCLK and generate the at-speed clock signal ACLK. During the capture phase of the at-speed testing of the IC 100, the at-speed clock signal ACLK may include the launch pulse and the capture pulse that are extracted from the reference clock signal RCLK based on the frequency associated with the capture phase. The plurality of clock gate controllers may be configured to generate the plurality of enable signals (e.g., the first and second enable signals EN1 and EN2) such that for the launch pulse, one of the plurality of enable signals is asserted, and for the capture pulse, one of a group consisting of the same enable signal and a different enable signal, of the plurality of enable signals, is asserted. Further, the plurality of clock gates may be coupled to the plurality of clock gate controllers, and configured to receive the plurality of enable signals. Each clock gate of the plurality of clock gates may be activated based on an assertion of a corresponding enable signal. During the capture phase, each of the plurality of clock gates may be further configured to receive the at-speed clock signal ACLK and one or more activated clock gates, of the plurality of clock gates, may be configured to enable the at-speed testing of the IC 100 based on the at-speed clock signal ACLK.

In another embodiment of the present disclosure, a method for controlling the at-speed testing of the IC 100 is disclosed. The method may include receiving the reference clock signal RCLK and generating the at-speed clock signal ACLK, by the clocking system 106, such that during the capture phase of the at-speed testing, the at-speed clock signal ACLK may include the launch pulse and the capture pulse that are extracted from the reference clock signal RCLK based on the frequency associated with the capture phase. Further, the method may include generating, by the plurality of clock gate controllers, the plurality of enable signals such that for the launch pulse, one of the plurality of enable signals may be asserted, and for the capture pulse, one of a group consisting of the same enable signal and the different enable signal, of the plurality of enable signals, is asserted. The method may further include, receiving, by the plurality of clock gates, the plurality of enable signals from the plurality of clock gate controllers. Each of the plurality of clock gates may be activated based on the assertion of a corresponding enable signal. The method may further include receiving, by each of the plurality of clock gates, the at-speed clock signal ACLK during the capture phase and enabling, during the capture phase, by one or more activated clock gates of the plurality of clock gates, the at-speed testing of the IC 100 based on the at-speed clock signal ACLK.

In some embodiments, the assertion of one of the plurality of enable signals for the launch pulse and the assertion of the different enable signal for the capture pulse may be indicative of the data launch operation of the capture phase being executed in one clock domain (e.g., the first clock domain) and the data capture operation of the capture phase being executed in another clock domain (e.g., the second clock domain) having a frequency that is different from a frequency of the first clock domain. The frequency associated with the capture phase corresponds to higher of a group consisting of the frequency of the first clock domain and the frequency of the second clock domain.

In some embodiments, the assertion of one of the plurality of enable signals for the launch pulse and the assertion of the same enable signal for the capture pulse may be indicative of the data launch operation and the data capture operation of the capture phase being executed in the same clock domain (e.g., the first clock domain). The frequency associated with the capture phase may correspond to the frequency of the first clock domain.

In some embodiments, the IC 100 may further include the PLL 102 that may be configured to generate the reference clock signal RCLK.

In some embodiments, the IC 100 may further include the plurality of functional circuits (e.g., the first and second functional circuits 118 and 120) coupled to the plurality of clock gates such that the first and second functional circuits 118 and 120 may be coupled to the first and second clock gates 114 and 116, respectively.

In some embodiments, during the capture phase, the first clock gate 114 may be activated and remaining clock gates of the plurality of clock gates may be deactivated. Further, the activated first clock gate 114 may be configured to provide the launch pulse and the capture pulse to the first functional circuit 118 to enable the at-speed testing of the first functional circuit 118. The first functional circuit 118 may be configured to execute the data launch and data capture operations based on the launch and capture pulses, respectively.

In some embodiments, for the launch pulse, the first clock gate 114 may be activated and remaining clock gates of the plurality of clock gates may be deactivated. Further, the activated first clock gate 114 may be configured to provide the launch pulse to the first functional circuit 118, and the first functional circuit 118 may be configured to execute the data launch operation based on the launch pulse. Further, for the capture pulse, the second clock gate 116 may be activated and remaining clock gates of the plurality of clock gates may be deactivated. Further, the activated second clock gate 116 may be configured to provide the capture pulse to the second functional circuit 120, and the second functional circuit 120 may be configured to execute the data capture operation based on the capture pulse.

In some embodiments, the clocking system 106 may include the launch and capture shift registers 208 and 210, each configured to receive the reference clock signal RCLK, and the register control circuit 206 that may be coupled to the launch and capture shift registers 208 and 210. The register control circuit 206 may be configured to determine the launch configuration value LV and the capture configuration value CV based on the frequency associated with the capture phase, and load the launch configuration value LV and the capture configuration value CV in the launch shift register 208 and the capture shift register 210, respectively. The launch configuration value LV may include the first plurality of data bits that may be shifted in the launch shift register 208 based on the reference clock signal RCLK such that for each cycle of the reference clock signal RCLK, the launch shift register 208 may be further configured to output a data bit of the launch configuration value LV as the launch pulse data bit LPD. Further, the capture configuration value CV may include the second plurality of data bits that may be shifted in the capture shift register 210 based on the reference clock signal RCLK such that for each cycle of the reference clock signal RCLK, the capture shift register 210 may be further configured to output a data bit of the capture configuration value CV as the capture pulse data bit CPD. Additionally, the launch and capture pulse data bits LPD and CPD may enable the extraction of the launch and capture pulses from the reference clock signal RCLK, respectively.

In some embodiments, the clocking system 106 may further include the test controller 202 that may be configured to determine the frequency associated with the capture phase, generate the control signal CS indicative of the determined frequency, and provide the control signal CS to the register control circuit 206 to enable the determination of the launch configuration value LV and the capture configuration value CV.

In some embodiments, the clocking system 106 may further include the memory 204 that may be configured to store the mapping between the plurality of frequency values, the plurality of launch configuration values, and the plurality of capture configuration values. The register control circuit 206 may be further coupled to the memory 204, and configured to compare the frequency associated with the capture phase with the plurality of frequency values and identify the frequency value of the plurality of frequency values that matches the frequency associated with the capture phase. Further, the launch configuration value LV and the capture configuration value CV may be determined from the plurality of launch configuration values and the plurality of capture configuration values, respectively, based on being mapped to the identified frequency value.

In some embodiments, during the capture phase, one of the first plurality of data bits and one of the second plurality of data bits may be asserted. The position of the asserted data bit in the launch configuration value LV and the position of the asserted data bit in the capture configuration value CV may be determined based on the frequency associated with the capture phase.

In some embodiments, during the capture phase, the launch pulse data bit LPD may be asserted for the first cycle of the reference clock signal RCLK and the capture pulse data bit CPD may be asserted for the second cycle of the reference clock signal RCLK that is different from the first cycle. A count of cycles between the first cycle and the second cycle may be determined based on the frequency associated with the capture phase.

In some embodiments, the clocking system 106 may further include the first logic gate 212 that may be coupled to the launch and capture shift registers 208 and 210, and the gating circuit 214 that may be coupled to the first logic gate 212. The first logic gate 212 may be configured to generate the gating signal GS based on the launch and capture pulse data bits LPD and CPD. The gating signal GS may be asserted based on the assertion of at least one of a group consisting of the launch and capture pulse data bits LPD and CPD. The gating signal GS may be de-asserted based on the launch and capture pulse data bits LPD and CPD being de-asserted. Further, the gating circuit 214 may be configured to generate the divided clock signal DCLK based on the reference clock signal RCLK and the gating signal GS. The divided clock signal DCLK may be de-asserted based on the de-assertion of the gating signal GS, and the divided clock signal DCLK may be same as the reference clock signal RCLK based on the assertion of the gating signal GS. During the capture phase, the divided clock signal DCLK may include the launch and capture pulses that correspond to the first and second cycles of the reference clock signal RCLK, respectively.

In some embodiments, the clocking system 106 may further include the first multiplexer 216 that may be coupled to the gating circuit 214. The first multiplexer 216 may be configured to receive the divided clock signal DCLK, the test clock signal TCLK, and the scan enable signal SE, and generate the at-speed clock signal ACLK. Based on the de-assertion of the scan enable signal SE, the at-speed clock signal ACLK may be same as the divided clock signal DCLK, and based on the assertion of the scan enable signal SE, the at-speed clock signal ACLK may be same as the test clock signal TCLK. The scan enable signal SE may be asserted during the shift phase and de-asserted during the capture phase.

In some embodiments, the test controller 202 may be coupled to the plurality of clock gate controllers, and configured to generate, for the plurality of clock gate controllers, the plurality of launch trigger signals (e.g., the first and second launch trigger signals LTS1 and LTS2) and the plurality of capture trigger signals (e.g., the first and second capture trigger signals CTS1 and CTS2). During the capture phase, one of the plurality of launch trigger signals may be asserted and remaining launch trigger signals of the plurality of launch trigger signals may be de-asserted. Further, during the capture phase, one of the plurality of capture trigger signals may be asserted and remaining capture trigger signals of the plurality of capture trigger signals may be de-asserted. Each clock gate controller of the plurality of clock gate controllers may generate the enable signal, of the plurality of enable signals, based on the corresponding launch trigger signal of the plurality of launch trigger signals, the corresponding capture trigger signal of the plurality of capture trigger signals, the launch pulse data bit LPD, and the capture pulse data bit CPD.

In some embodiments, the test controller 202 may be further configured to determine whether the data launch and data capture operations are to be executed in one of a group consisting of the same clock domain and different clock domains. The test controller 202 may be further configured to identify, from the plurality of clock gate controllers, the clock gate controller that is associated with the clock domain of the data launch operation and the clock gate controller that is associated with the clock domain of the data capture operation. Further, the test controller 202 may be configured to provide the asserted launch trigger signal to the clock gate controller that is associated with the clock domain of the data launch operation and the asserted capture trigger signal to the clock gate controller that is associated with the clock domain of the data capture operation.

In some embodiments, each clock gate controller (e.g., the first clock gate controller 110) of the plurality of clock gate controllers may include the logic circuit 302 that may be coupled to the test controller 202 and the launch and capture shift registers 208 and 210. The logic circuit 302 may be configured to generate a logic signal (e.g., the third logic signal LG3) based on the launch pulse data bit LPD, the capture pulse data bit CPD, the corresponding launch trigger signal (e.g., the first launch trigger signal LTS1) of the plurality of launch trigger signals, and the corresponding capture trigger signal (e.g., the first capture trigger signal CTS1) of the plurality of capture trigger signals. The third logic signal LG3 may be asserted based on at least one of a group consisting of the assertion of both the launch pulse data bit LPD and the first launch trigger signal LTS1 and the assertion of both the capture pulse data bit CPD and the first capture trigger signal CTS1. Conversely, the third logic signal LG3 is de-asserted based on the de-assertion of at least one of a group consisting of the launch pulse data bit LPD and the first launch trigger signal LTS1 and the de-assertion of at least one of a group consisting of the capture pulse data bit CPD and the first capture trigger signal CTS1. Further, the enable signal (e.g., the first enable signal EN1), of the plurality of enable signals, generated by the corresponding clock gate controller is same as the third logic signal LG3 during the capture phase.

In some embodiments, the test controller 202 may be configured to generate the plurality of domain trigger signals (e.g., the first and second domain trigger signals DTS1 and DTS2) and provide the plurality of domain trigger signals to the plurality of clock gate controllers. During the capture phase, each domain trigger signal may be asserted based on the data launch and data capture operations being executed in the clock domain associated with the corresponding clock gate controller. Additionally, the plurality of enable signals may be same as the plurality of domain trigger signals.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. An integrated circuit (IC), comprising:

a clocking system configured to receive a reference clock signal and generate an at-speed clock signal, wherein during a capture phase of an at-speed testing of the IC, the at-speed clock signal comprises a launch pulse and a capture pulse that are extracted from the reference clock signal based on a frequency associated with the capture phase;

a plurality of clock gate controllers configured to generate a plurality of enable signals such that for the launch pulse, one of the plurality of enable signals is asserted, and for the capture pulse, one of a group consisting of (i) the same enable signal and (ii) a different enable signal, of the plurality of enable signals, is asserted; and a plurality of clock gates that is coupled to the plurality of clock gate controllers, and configured to receive the plurality of enable signals, wherein each clock gate of the plurality of clock gates is activated based on an assertion of a corresponding enable signal, and wherein during the capture phase, (i) each of the plurality of clock gates is further configured to receive the at-speed clock signal and (ii) one or more activated clock gates, of the plurality of clock gates, are configured to enable the at-speed testing of the IC based on the at-speed clock signal; wherein the clocking system comprises:

a launch shift register and a capture shift register, each configured to receive the reference clock signal; and a register control circuit that is coupled to the launch shift register and the capture shift register, and configured to determine a launch configuration value and a capture configuration value based on the frequency associated with the capture phase and load the launch configuration value and the capture configuration value in the launch shift register and the capture shift register, respectively, wherein the launch configuration value comprises a first plurality of data bits that is shifted in the launch shift register based on the reference clock signal such that for each cycle of the reference clock signal, the launch shift register is further configured to output a data bit of the launch configuration value as a launch pulse data bit, wherein the capture configuration value comprises a second plurality of data bits that is shifted in the capture shift register based on the reference clock signal such that for each cycle of the reference clock signal, the capture shift register is further configured to output a data bit of the capture configuration value as a capture pulse data bit, and wherein the launch pulse data bit and the capture pulse data bit enable the extraction of the launch pulse and the capture pulse from the reference clock signal, respectively.

2. The IC of claim 1, wherein the assertion of one of the plurality of enable signals for the launch pulse and the assertion of the different enable signal for the capture pulse are indicative of a data launch operation of the capture phase being executed in a first clock domain and a data capture operation of the capture phase being executed in a second clock domain having a frequency that is different from a frequency of the first clock domain, and wherein the frequency associated with the capture phase corresponds to higher of a group consisting of (i) the frequency of the first clock domain and (ii) the frequency of the second clock domain.

3. The IC of claim 1, wherein the assertion of one of the plurality of enable signals for the launch pulse and the assertion of the same enable signal for the capture pulse are indicative of a data launch operation of the capture phase and a data capture operation of the capture phase being executed in a first clock domain, and wherein the frequency associated with the capture phase corresponds to a frequency of the first clock domain.

4. The IC of claim 1, further comprising a phase-locked loop (PLL) that is configured to generate the reference clock signal.

5. The IC of claim 1, further comprising a plurality of functional circuits coupled to the plurality of clock gates such that a first functional circuit of the plurality of functional circuits is coupled to a first clock gate of the plurality of clock gates, wherein during the capture phase, (i) the first clock gate is activated and remaining clock gates of the plurality of clock gates are deactivated, (ii) the activated first clock gate is further configured to provide the launch pulse and the capture pulse to the first functional circuit, and (iii) the first functional circuit is configured to execute a data launch operation and a data capture operation of the capture phase based on the launch pulse and the capture pulse, respectively.

6. The IC of claim 1, further comprising a plurality of functional circuits coupled to the plurality of clock gates such that a first functional circuit and a second functional circuit of the plurality of functional circuits are coupled to a first clock gate and a second clock gate of the plurality of clock gates, respectively, wherein for the launch pulse, (i) the first clock gate is activated and remaining clock gates of the plurality of clock gates are deactivated, (ii) the activated first clock gate is further configured to provide the launch pulse to the first functional circuit, and (iii) the first functional circuit is configured to execute, based on the launch pulse, a data launch operation of the capture phase, and wherein for the capture pulse, (i) the second clock gate is activated and remaining clock gates of the plurality of clock gates are deactivated, (ii) the activated second clock gate is further configured to provide the capture pulse to the second functional circuit, and (iii) the second functional circuit is configured to execute, based on the capture pulse, a data capture operation of the capture phase.

7. The IC of claim 1, wherein the clocking system further comprises a test controller that is configured to:

determine the frequency associated with the capture phase;

generate a control signal indicative of the determined frequency; and provide the control signal to the register control circuit to enable the determination of the launch configuration value and the capture configuration value.

8. The IC of claim 1, wherein the clocking system further comprises a memory that is configured to store a mapping between a plurality of frequency values, a plurality of launch configuration values, and a plurality of capture configuration values, wherein the register control circuit is further coupled to the memory, and configured to compare the frequency associated with the capture phase with the plurality of frequency values and identify a frequency value of the plurality of frequency values that matches the frequency associated with the capture phase, and wherein the launch configuration value and the capture configuration value are determined from the plurality of launch configuration values and the plurality of capture configuration values, respectively, based on being mapped to the identified frequency value.

9. The IC of claim 1, wherein during the capture phase, one of the first plurality of data bits and one of the second plurality of data bits are asserted, and wherein a position of the asserted data bit in the launch configuration value and a position of the asserted data bit in the capture configuration value are determined based on the frequency associated with the capture phase.

10. The IC of claim 1, wherein during the capture phase, the launch pulse data bit is asserted for a first cycle of the reference clock signal and the capture pulse data bit is asserted for a second cycle of the reference clock signal that is different from the first cycle, with a count of cycles between the first cycle and the second cycle being determined based on the frequency associated with the capture phase.

11. The IC of claim 10, wherein the clocking system further comprises:

a logic gate that is coupled to the launch shift register and the capture shift register, and configured to generate a gating signal based on the launch pulse data bit and the capture pulse data bit, wherein the gating signal is asserted based on the assertion of at least one of a group consisting of the launch pulse data bit and the capture pulse data bit, and wherein the gating signal is de-asserted based on the launch pulse data bit and the capture pulse data bit being de-asserted; and a gating circuit that is coupled to the logic gate, and configured to generate a divided clock signal based on the reference clock signal and the gating signal, wherein the divided clock signal is de-asserted based on the de-assertion of the gating signal, and the divided clock signal is same as the reference clock signal based on the assertion of the gating signal, and wherein during the capture phase, the divided clock signal comprises the launch pulse and the capture pulse that correspond to the first cycle and the second cycle of the reference clock signal, respectively.

12. The IC of claim 11, wherein the clocking system further comprises a multiplexer that is coupled to the gating circuit, and configured to receive the divided clock signal, a test clock signal, and a scan enable signal, and generate the at-speed clock signal, wherein based on a de-assertion of the scan enable signal, the at-speed clock signal is same as the divided clock signal, and based on an assertion of the scan enable signal, the at-speed clock signal is same as the test clock signal, and wherein the scan enable signal is asserted during a shift phase of the at-speed testing and de-asserted during the capture phase.

13. The IC of claim 1, wherein the clocking system further comprises a test controller that is coupled to the plurality of clock gate controllers, and configured to generate, for the plurality of clock gate controllers, a plurality of launch trigger signals and a plurality of capture trigger signals, wherein during the capture phase, (i) one of the plurality of launch trigger signals is asserted and remaining launch trigger signals of the plurality of launch trigger signals are de-asserted and (ii) one of the plurality of capture trigger signals is asserted and remaining capture trigger signals of the plurality of capture trigger signals are de-asserted, and wherein each clock gate controller of the plurality of clock gate controllers generates an enable signal, of the plurality of enable signals, based on a launch trigger signal of the plurality of launch trigger signals, a capture trigger signal of the plurality of capture trigger signals, the launch pulse data bit, and the capture pulse data bit.

14. The IC of claim 13, wherein the test controller is further configured to:

determine whether a data launch operation and a data capture operation of the capture phase are to be executed in one of a group consisting of (i) a same clock domain and (ii) different clock domains;

identify, from the plurality of clock gate controllers, a clock gate controller that is associated with a clock domain of the data launch operation and a clock gate controller that is associated with a clock domain of the data capture operation; and provide the asserted launch trigger signal to the clock gate controller that is associated with the clock domain of the data launch operation and the asserted capture trigger signal to the clock gate controller that is associated with the clock domain of the data capture operation.

15. The IC of claim 13, wherein each clock gate controller of the plurality of clock gate controllers comprises a logic circuit that is coupled to the test controller, the launch shift register, and the capture shift register, and configured to generate a logic signal based on the launch pulse data bit, the capture pulse data bit, the launch trigger signal of the plurality of launch trigger signals, and the capture trigger signal of the plurality of capture trigger signals, wherein the logic signal is asserted based on at least one of a group consisting of (i) the assertion of the launch pulse data bit and an assertion of the launch trigger signal and (ii) the assertion of the capture pulse data bit and an assertion of the capture trigger signal, and the logic signal is de-asserted based on (i) at least one of a group consisting of the launch pulse data bit and the launch trigger signal being de-asserted and (ii) at least one of a group consisting of the capture pulse data bit and the capture trigger signal being de-asserted, and wherein an enable signal, of the plurality of enable signals, generated by the corresponding clock gate controller is same as the logic signal during the capture phase.

16. An integrated circuit (IC), comprising:

a clocking system configured to receive a reference clock signal and generate an at-speed clock signal, wherein during a capture phase of an at-speed testing of the IC, the at-speed clock signal comprises a launch pulse and a capture pulse that are extracted from the reference clock signal based on a frequency associated with the capture phase;

a plurality of clock gate controllers configured to generate a plurality of enable signals such that for the launch pulse, one of the plurality of enable signals is asserted, and for the capture pulse, one of a group consisting of (i) the same enable signal and (ii) a different enable signal, of the plurality of enable signals, is asserted; and a plurality of clock gates that is coupled to the plurality of clock gate controllers, and configured to receive the plurality of enable signals, wherein each clock gate of the plurality of clock gates is activated based on an assertion of a corresponding enable signal, and wherein during the capture phase, (i) each of the plurality of clock gates is further configured to receive the at-speed clock signal and (ii) one or more activated clock gates, of the plurality of clock gates, are configured to enable the at-speed testing of the IC based on the at-speed clock signal; wherein the clocking system comprises a test controller that is configured to generate a plurality of domain trigger signals and provide the plurality of domain trigger signals to the plurality of clock gate controllers, wherein during the capture phase, each domain trigger signal is asserted based on a data launch operation and a data capture operation of the capture phase being executed in a clock domain associated with the corresponding clock gate controller, and wherein the plurality of enable signals is same as the plurality of domain trigger signals during the capture phase.

17. A method for controlling an at-speed testing of an integrated circuit (IC), the method comprising:

receiving, by a clocking system, a reference clock signal;

generating, by the clocking system, an at-speed clock signal such that during a capture phase of the at-speed testing, the at-speed clock signal comprises a launch pulse and a capture pulse that are extracted from the reference clock signal based on a frequency associated with the capture phase;

generating, by a plurality of clock gate controllers, a plurality of enable signals such that for the launch pulse, one of the plurality of enable signals is asserted, and for the capture pulse, one of a group consisting of (i) the same enable signal and (ii) a different enable signal, of the plurality of enable signals, is asserted;

receiving, by a plurality of clock gates, the plurality of enable signals from the plurality of clock gate controllers, wherein each of the plurality of clock gates is activated based on an assertion of a corresponding enable signal;

receiving, by each of the plurality of clock gates, the at-speed clock signal during the capture phase; and enabling, during the capture phase, by one or more activated clock gates of the plurality of clock gates, the at-speed testing of the IC based on the at-speed clock signal;

wherein the clocking system comprises:

a launch shift register and a capture shift register, each configured to receive the reference clock signal; and a register control circuit that is coupled to the launch shift register and the capture shift register, and configured to determine a launch configuration value and a capture configuration value based on the frequency associated with the capture phase and load the launch configuration value and the capture configuration value in the launch shift register and the capture shift register, respectively, wherein the launch configuration value comprises a first plurality of data bits that is shifted in the launch shift register based on the reference clock signal such that for each cycle of the reference clock signal, the launch shift register is further configured to output a data bit of the launch configuration value as a launch pulse data bit, wherein the capture configuration value comprises a second plurality of data bits that is shifted in the capture shift register based on the reference clock signal such that for each cycle of the reference clock signal, the capture shift register is further configured to output a data bit of the capture configuration value as a capture pulse data bit, and wherein the launch pulse data bit and the capture pulse data bit enable the extraction of the launch pulse and the capture pulse from the reference clock signal, respectively.

18. The method of claim 17, wherein the assertion of one of the plurality of enable signals for the launch pulse and the assertion of the same enable signal for the capture pulse are indicative of a data launch operation and a data capture operation of the capture phase being executed in a first clock domain, and wherein the frequency associated with the capture phase corresponds to a frequency of the first clock domain.

19. The method of claim 17, wherein the assertion of one of the plurality of enable signals for the launch pulse and the assertion of the different enable signal for the capture pulse is indicative of a data launch operation of the capture phase being executed in a first clock domain and a data capture operation of the capture phase being executed in a second clock domain having a frequency that is different from a frequency of the first clock domain, and wherein the frequency associated with the capture phase corresponds to higher of a group consisting of (i) the frequency of the first clock domain and (ii) the frequency of the second clock domain.

* * * * *